United States Patent [19]

Ito

[11] Patent Number: 4,928,060
[45] Date of Patent: May 22, 1990

[54] DRIVING CIRCUIT OF A CROSSED-COIL TYPE INSTRUMENT USING DIGITAL DATA PULSE PRODUCTION

[75] Inventor: Akio Ito, Konosu, Japan

[73] Assignee: Jeco Company, Ltd., Japan

[21] Appl. No.: 305,414

[22] Filed: Feb. 1, 1989

[30] Foreign Application Priority Data

Feb. 5, 1988 [JP] Japan .................................. 63-25180

[51] Int. Cl.$^5$ .................... G01R 11/36; G01P 3/48
[52] U.S. Cl. ................................... 324/143; 324/144; 324/146; 324/166; 324/160
[58] Field of Search ............... 324/140 R, 143, 144, 324/146, 147, 151 R, 151 A, 154 R, 160, 166, 167

[56] References Cited

U.S. PATENT DOCUMENTS

| | | | |
|---|---|---|---|
| 3,946,311 | 3/1976 | Baker et al. | 324/140 R X |
| 4,230,984 | 10/1980 | Taylor | 324/140 R X |
| 4,556,885 | 12/1985 | Kurosawa | 324/167 X |
| 4,827,209 | 5/1989 | Tanaka et al. | 324/143 |

FOREIGN PATENT DOCUMENTS 60368 5/1985 Japan .

*Primary Examiner*—Reinhard J. Eisenzopf
*Assistant Examiner*—Jack B. Harvey
*Attorney, Agent, or Firm*—Andrus, Sceales, Starke & Sawall

[57] ABSTRACT

A driving circuit for driving a crossed-coil type instrument used for reading a physical quantity in which a pair of windings surrounding a movable magnet carrying a pointer needle thereon are disposed to cross each other with a predetermined mechanical angle. The driving circuit comprises a digital data conversion circuit supplied with an electrical signal representing the physical quantity to be measured for producing a digital data representing the electrical signal, a pulse data producing circuit supplied with the digital data for producing a number of pulses in correspondence with the digital data, and a drive signal generating circuit supplied with the pulses for generating first and second analog drive signals therefrom. The driving signals are respectively supplied to the first and second windings for moving the magnet disposed in the first and second windings.

11 Claims, 4 Drawing Sheets

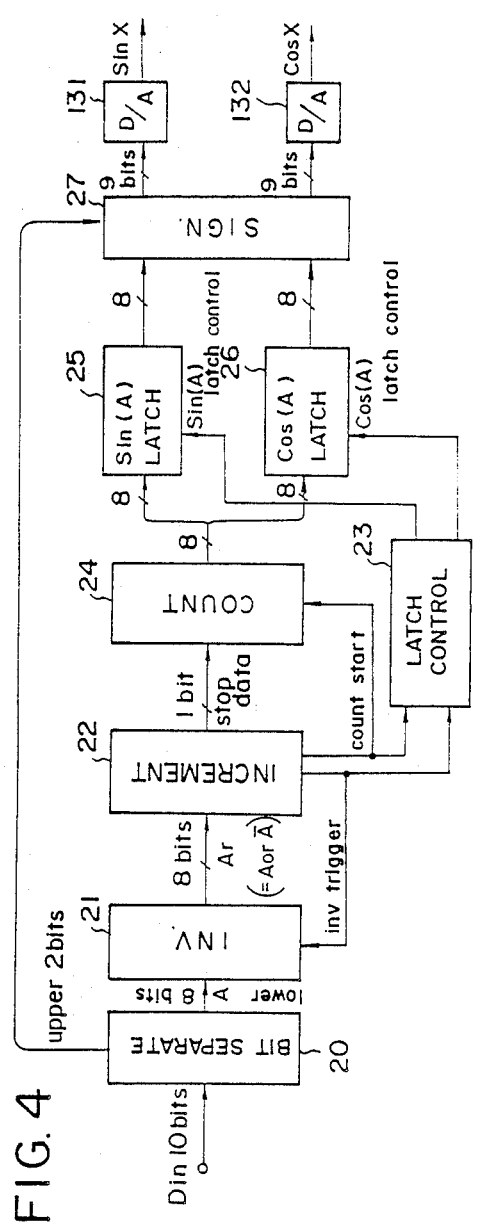
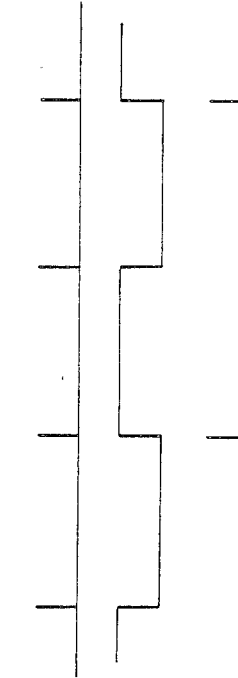
FIG. 5a COUNT START
FIG. 5b INVERSION TRIGGER
FIG. 5c Sin A LATCH
FIG. 5d Cos A LATCH FIG. 6
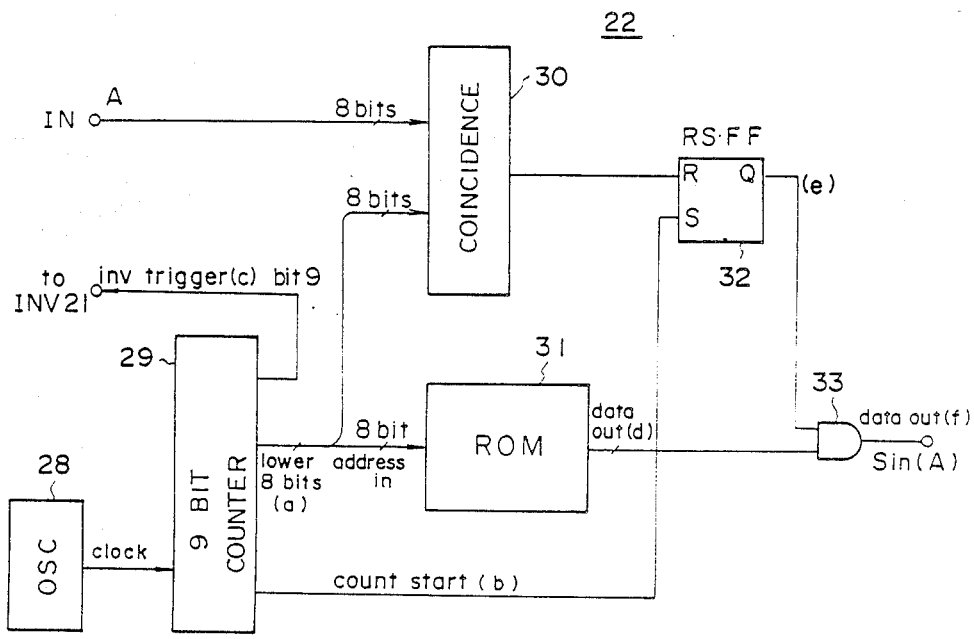
FIG. 7a COUNTER OUT
FIG. 7b COUNT START
FIG. 7c INVERSION TRIGGER
FIG. 7d ROM OUT
FIG. 7e RS·FF Q OUT
FIG. 7f DATA OUT

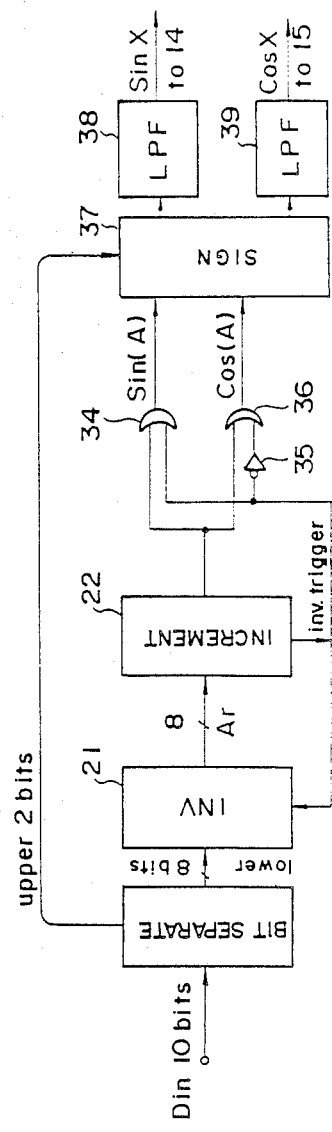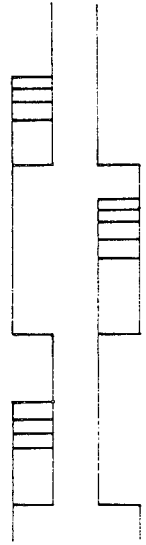
FIG. 9a  COUNT START
FIG. 9b  INVERSION OUT
FIG. 9c  Sin A
FIG. 9d  Cos A

DRIVING CIRCUIT OF A CROSSED-COIL TYPE INSTRUMENT USING DIGITAL DATA PULSE PRODUCTION

BACKGROUND OF THE INVENTION

The present invention generally relates to driving circuits for driving a crossed-coil type instruments, and in particular to a driving circuit for a crossed-coil type instruments used in automobiles and the like for indicating data such as engine revolution, car speed and the like.

Conventionally, crossed-coil type instruments are used commonly in automobiles and the like for indicating engine revolution, car speed and the like, because of its simple and solid construction and excellent reliability. A typical crossed-coil type instrument comprises a first and a second coils or windings disposed perpendicularly to each other in mechanical angle, and a permanent magnet is disposed in a space defined in the first and second windings such that the magnet can rotate about an axis. Coincident to this axis, the magnet carries a shaft which in turn carries a pointer needle thereon. The pointer needle is moved when a signal which changes sinusoidally or near-sinusoidally with respect to the electrical angle is supplied to the first and second windings with a 90 degree phase difference. The electrical angle of the sinusoidal signal is changed in accordance with the quantity to be measured such as the engine revolution or car speed, and as a result, the argument of the vector of a magnetic flux which is synthesized from a first magnetic flux from the first winding and a second magnetic flux from the second winding is changed in correspondence with the quantity to be measured. Together with the change in the argument of the magnetic flux, the permanent magnet is rotated and the pointer needle is moved over the dial of the instrument.

It is ideal to use a sinusoidal signal for driving such a crossed-coil type instrument. However, the use of sinusoidal signal for the driving signal raises a problem particularly when a digital equipment such as microcomputer and the like is used as a driving means in that enormous memory capacity is required to store the level of the sinusoidal signal in correspondence with each electrical angle. In other words, a memory device having an enormous memory capacity has to be used for storing the sinusoidal signal. Of course, such a use of the large capacity memory device for instruments used in the automobiles and the like is unpractical in view of the available space, cost, and the like.

In order to avoid this problem, conventional car-born instruments uses a trapezoidal signal for the driving signal as an approximation of the sinusoidal signal as is disclosed in the Japanese Laid-open Patent Publication No. 60-368. However, the use of such a trapezoidal signal in place of the sinusoidal signal produces a poor accuracy due to the deviation from the ideal sinusoidal signal. Further, the magnitude of the synthetic magnetic flux is not constant as compared with the case in which the real sinusoidal signal is used for driving the first and second windings. As a result, the movement of the pointer needle over the dial of the instrument becomes non-uniform which further deteriorates the problem of inaccurate reading of such an instrument.

SUMMARY OF THE INVENTION

Accordingly, it is a general object of the present invention to provide a novel and useful driving circuit for a crossed-coil type instrument in which the aforementioned problem is eliminated.

Another object of the present invention is to provide a driving circuit for a crossed-coil type instrument having a relatively simple construction, realizing a high reading accuracy, and wherein the movement of the pointer needle is uniform and smooth throughout the range of the instrument.

Another object of the present invention is to provide a driving circuit for energizing a plurality of windings of a crossed-coil type instrument in which each of the windings is disposed perpendicularly to each other so as to surround a movable permanent magnet carrying a pointer needle thereon, comprising digital signal generating means for generating a digital signal responsive to a physical quantity to be measured and driving signal generating means for producing a plurality of sinusoidal driving signals to be supplied to said plurality of windings, said plurality of sinusoidal driving signals having a level which changes sinusoidally with electrical angle which in turn is changed in accordance with said digital signal, wherein said driving signal generating means further comprises memory means for storing a stepwise increment value of a step function approximating a sinusoidal function together with a corresponding electrical angle as parameter, reading means for reading out said increment value for a range of electrical angles which range from a reference value to an angle corresponding to said digital signal from the memory means as a series of increment data, and drive signal synthesizing means for synthesizing the sinusoidal driving signals responsive to the increment data read out from the memory means and for supplying the sinusoidal driving signals thus synthesized to respective windings. According to the present invention, a driving signal more closely approximating the sinusoidal signal is obtained with a less memory capacity as a result of the use of the increment value. As a result, the accuracy in the reading of the instrument is greatly improved. Further, the pointer needle moves smoothly as the magnitude of the synthetic flux vector can be made virtually constant. This is of course due to the fact that the synthesized driving signals closely approximate the sinusoidal signal. Further, by changing the increment value to be stored in the memory means, one can easily obtain a driving signal having an arbitrary waveform.

Other objects and further features of the present invention will become apparent from the following detailed description of preferred embodiments when read in conjunction with attached drawings.

BRIEF DESCRIPTION OF THE DRAWINGS

FIG. 4 is a block diagram showing a part of the circuit of FIG. 1 which is pertinent to the present invention;

FIG. 5 (a)-(d) is a timing chart for explanation of the operation of the circuit part of FIG. 4;

FIG. 6 is a block diagram showing a part of the circuit of FIG. 4;

FIG. 7 (a)-(f) is a timing chart for explanation of the operation of the circuit part of FIG. 6;

FIG. 8 is a block diagram showing another construction of the circuit part of FIG. 4; and FIG. 9 (a)-(d) is a timing chart for explanation of the operation of the circuit part of FIG. 8.

DETAILED DESCRIPTION

Figure 1:
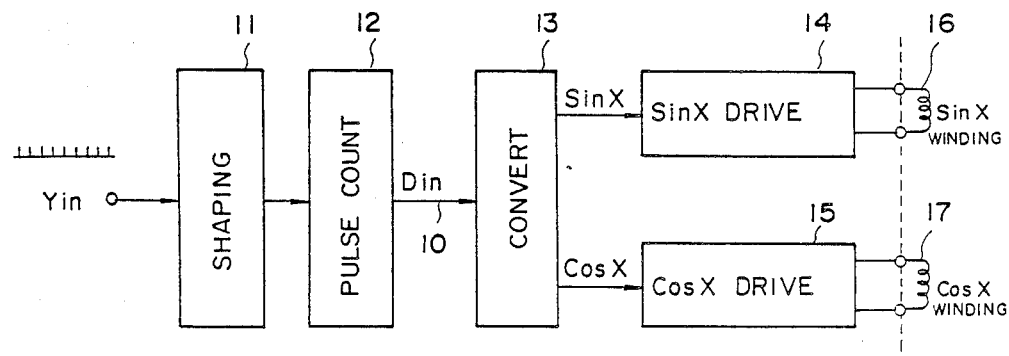
FIG. 1 is a block diagram showing the construction of the driving circuit of a crossed-coil type instrument according to the present invention.

FIG. 1 shows a block diagram of an embodiment of the driving circuit of the present invention. Referring to the drawing, a signal Y to be measured which may comprise a pulse train produced in correspondence with the engine revolution, car speed and the like, is supplied to a pulse shaping circuit 11 for pulse shaping. Thereafter, the signal Y is supplied to a frequency count circuit 12 which counts the number of output pulses produced by the pulse shaping circuit 11 for each predetermined time interval and produces a ten-bit data Din which represents the number of pulses thus counted. This pulse shaping circuit 11 and the frequency count circuit 12 constitute a digital signal generating means.

The output digital data Din is supplied to a sinusoidal conversion circuit 13 which constitutes the essential part of the present invention. As will be described later, the circuit 13 produces signals respectively corresponding to a sine signal, sin X, and a cosine signal, cos X, in response to the 10 bit digital data, and these sine and cosine signals are supplied to a pair of windings 16 and 17 disposed mutually with a mechanical angle of 90 degrees via a driving circuit 14 for the sine signal and another driving circuit 15 for the cosine signal, respectively. The windings 16 and 17 enclose a permanent magnet in a space defined therein in a manner such that the magnet is movable about a rotational axis. The sinusoidal conversion circuit 13 and the driving circuits 14, 15 constitute a drive signal generating means.

Figure 2:
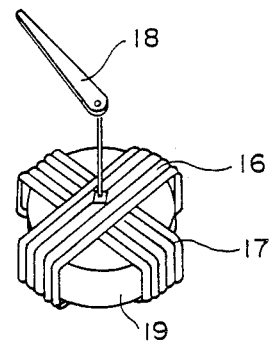
FIG. 2 is a perspective view showing the crossed-coil type instrument driven by the driving circuit of the present invention.
Figure 3:
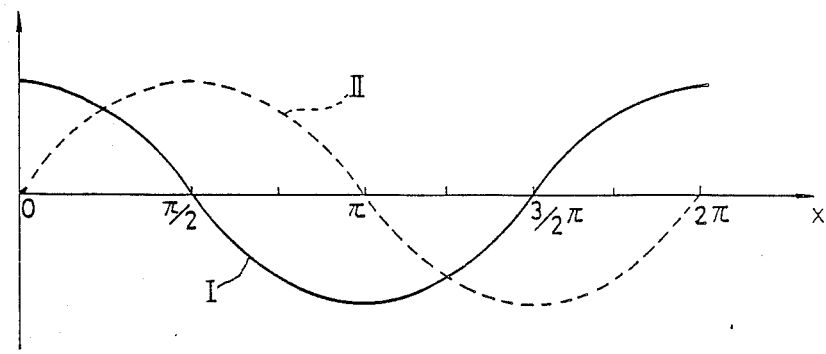
FIG. 3 is a waveform chart showing the driving signal which drives the instrument of FIG. 2.

FIG. 2 is a perspective view showing the windings 16 and 17 together with a permanent magnet 19 on which a pointer needle 18 is mounted. It can be seen that the windings 16 and 17 are disposed with a mutual mechanical angle of 90 degrees, and the magnet 19 is accommodated in the space defined in the windings 16 and 17. When a sine signal I and a cosine signal II in FIG. 3 respectively corresponding to the cos X signal and sin X signal are supplied to the windings 16 and 17, the magnet 19 is rotated and the pointer needle 18 is moved to a position of the instrument dial which corresponds to the value of the measured quantity X.

Next, an embodiment of the sinusoidal conversion circuit 13 which constitutes the essential part of the present invention will be described. FIG. 4 is a block diagram showing a first embodiment of the sinusoidal conversion circuit 13 and FIG. 5 is a timing chart for explanation of the sinusoidal conversion circuit.

The ten bit digital data Din supplied to the sinusoidal conversion circuit 13 is separated by a known manner by a separating circuit 20 such as a register, and the lower eight bit data represented by a symbol A are supplied to an inversion circuit 21 while the upper two bit data are supplied to a sign selection circuit 27. As will be described, an increment producing circuit 22 produces a one bit increment data sequentially in response to the eight bit digital data A from the inversion circuit 21.

Next, the circuit 22 which constitutes an essential part of the present invention will be described with reference to FIGS. 6 and 7. Referring to FIG. 6, the increment producing circuit 22 constitutes a reading circuit for reading out an increment data which represents a stepwise increment of a step function used to approximate a sinusoidal function. The circuit 22 comprises an oscillator 28 and a counter 29 which control the timing of operation of the circuit 22, a coincidence detector 30, RS type flip-flop 32 and an AND gate 33 for controlling an output data of the circuit 22 responsive to the input data A, and a read-only memory (ROM) 31 which constitutes a memory circuit for storing the stepwise increment of the step function together with the corresponding electrical angle data A.

The counter 29 is a binary counter for counting a clock pulse from the oscillator 28 and produces a 9 bit digital data. The lower 8 bits thereof are supplied to the coincidence detector 30 and to an address input of the ROM 31, while the ninth bit thereof is supplied to the inversion circuit 21 as an inversion trigger signal. Further, the counter 29 produces a count start signal when the lower 8 bits of the count value held therein has reached zero.

The coincidence detector 30 compares an output digital data of the counter 29 and the input digital data A and produces a high level or low level signal when the both have coincided. The RS flip-flop 32 receives the count start signal from the counter 29 at its set input and receives an output signal from the coincidence detector 30 at its reset input. The output of the flip-flop 32 is supplied to the AND gate 33.

The AND gate receives the output data of the ROM 31 at an input terminal and the output signal of the RS flip-flop 32 at another input terminal, and selectively masks the output data of the ROM 31 responsive to the state of the output signal of the RS flip-flop 32.

Next, the ROM 31 will be described. As aforementioned, the ROM 31 stores the stepwise increment of the step function used to approximate the sinusoidal function.

For example, when processing the input data A with a resolution of 8 bits, an 8 bit data corresponding to a number 256 is assigned to the electrical angle of 90 degrees ($\pi/2$), and a sinusoidal function sin (A) is approximated by a step function f(A) defined as $$f(A) = K \cdot \sin (A/256 \cdot \pi/2) \quad (A1, 2, \ldots, 256).$$

Here, the value of K is determined such that the maximum of the stepwise increment is unity in order to simplify the circuit construction. When the stepwise increment from a first step (A=0) to a next step (A=1) is unity, the following relation holds:

$$f(1) - f(0) = 1.$$

From this equation, the value of K is determined as K=163. In other words, the magnitude of the step function f(A) becomes 163.

Thus, the circuit 22 uses the step function f(A) instead of a true sinusoidal function sin (A), and one bit data representing the stepwise increment is produced responsive to the addressing of the ROM 31. The following Table I shows some example of the function f(A) and the stepwise increment together with the electrical angle and the value of data A.

Next, the operation of the circuit 22 will be described with reference to the timing chart of FIG. 7. When the lower 8 bit of the output data of the counter 29 has become zero (FIG. 7(a)), a count start signal shown in FIG. 2(b) is produced. Responsive to this, the RS flip-flop 32 is set and one of the inputs to the AND gate 33 changes to a high level. In this state, the AND gate 33 is ready to pass the output data of the ROM 31 therethrough.

TABLE I

| Electrical Angle | A | f(A) | stepwise increment |
| --- | --- | --- | --- |
| 52.73 | 150 | 130 | 0 |
| 53.09 | 151 | 130 | 1 |
| 53.44 | 152 | 131 | 1 |
| 53.79 | 153 | 132 | 0 |
| 54.14 | 154 | 132 | 1 |
| 54.49 | 155 | 133 | 0 |
| 54.84 | 156 | 133 | 1 |
| 55.20 | 157 | 134 | 0 |
| 55.55 | 158 | 134 | 1 |
| 55.90 | 159 | 135 | 1 |

Meanwhile, the counter 29 counts up the clock pulse from the oscillator 28 and during this period, the content of the ROM 31 is outputted sequentially through the gate 33 (FIG. 2(d)). When the coincidence detector 30 has decided that the output data of the counter 29 has coincided with the input data A, the RS flip-flop 32 is reset by the output of the coincidence detector 30 and the output thereof shown in FIG. 7(d) assumes a low level (FIG. 7(e)). As a result, the AND gate 33 is disabled (FIG. 7(f)).

With a further progress in the counting in counter 29, the value of the lower 8 bits of the count data returns to zero. Responsive to this, the procedure described heretofore is repeated. It should be noted that the level of the inversion trigger signal is changed from 1 low level to high level, or from high level to low level each time the lower 8 bits of the output data of the counter 29 returns to zero (FIG. 7(c)).

Referring to FIG. 4 again, the 10 bit digital data Din from the frequency count circuit 12 (FIG. 1) is distributed such that the lower 8 bits thereof are supplied to the inversion circuit 21 and the upper two bits thereof are supplied to the sign selection circuit 27. The inversion circuit 21 is the circuit for obtaining a cos (A) output from the increment producing circuit 22 and produces the inversion trigger signal denoted as Inv and an output data Ar as follows:

| Inv = low, Ar = A, | when outputting sin(A); and |
| --- | --- |
| Inv = high, Ar = 256 − A | when outputting cos(A). |

The output data Ar is supplied to the increment producing circuit 22. In order to simplify the circuit construction, one may define Ar as Ar=255−A when outputting cos (A).

A latch control circuit 23 produces latch control signals to be supplied to a latch circuit 25 for sin (A) and another latch circuit 26 for cos (A) to be described to control the operation thereof responsive to the inversion trigger signal from the circuit 22. On the other hand, the one bit increment data from the increment producing circuit 22 is supplied to a counter 24 where the one bit data is counted up and a data representing the amplitude of the sinusoidal signal sin (A) is produced.

The latch circuits 25 and 26 respectively latches up the output data from the counter 24 responsive to the respective latch control signals which in turn is controlled by the inversion trigger signal. For example, when the inversion trigger signal Inv is low, the latch 25 is selectively operated and when the signal Inv is high, the latch 26 is operated. The latched digital data are then supplied to the sign selection circuit 27 where the data are added with appropriate sign data and passed through digital-to-analogue converters 131 and 132 where they are converted to analogue drive signals sin X and cos X. Thereafter, the drive signal are supplied to the windings 16 and 17 via respective driving circuits 14 and 15 (FIG. 1).

Next, operation of the circuit 13 will be described. When the inversion trigger signal is turned to low and the count start signal is produced simultaneously, the counter 24 is reset and the outputting of the increment data from the increment producing circuit 22 is commenced. In this mode of operation, the output Ar of the inversion circuit 21 is set equal to A and the circuit 22 produces the pulse data representing the stepwise increment of the step function approximating the function sin (A). In other words, the increment data corresponding to sin (A) is outputted sequentially. This increment data is counted up in the counter 24 as already described.

When the synthesis is completed (number of pulses corresponding to sin (A) is produced), the value held in the counter 24 is latched up in the latch circuit 25 responsive to the latch control signal from the latch control circuit 23. Then, the inversion trigger signal is turned to high, and the inversion circuit 21 produces the output data Ar which is, this time, defined as Ar=256−A. Using Ar, the increment producing circuit 22 produces the increment data for cos (A). At the same time, the counter 24 is reset by the count start signal from the circuit 22 and the counting for cos (A) is commenced in the counter 24. When the synthesis is completed, the count value corresponding to cos (A) is latched up in the latch circuit 26 similarly to the case of sin (A).

The latched data representing sin (A) and cos (A) are then added with plus or minus sign using the upper two bit data of Din by the sign selection circuit as listed in the following Table II. The sin (A) and cos (A) data having the sign thus added are then converted to an analogue signal in the digital-to-analogue converters 131 and 132 and are then supplied to the windings 16 and 17 respectively after passing through the driving circuits 14 and 15.

TABLE II

| Din upper 2 bits | 00 | 01 | 10 | 11 |
| --- | --- | --- | --- | --- |
| sin X | +sin(A) | +cos(A) | −sin(A) | −cos(A) |
| cos X | +cos(A) | −sin(A) | −cos(A) | +sin(A) |

FIG. 8 is a block diagram showing a second embodiment of the sinusoidal conversion circuit in which a same increment producing circuit 22 is used, and FIG. 9 is a timing chart for explaining the operation of the circuit of FIG. 8.

In this embodiment, too, the separation circuit 20, inversion circuit 21 and the increment producing circuit 22 operate the same as those of the first embodiment. However, in the present embodiment, the output data of the increment producing circuit 22 is separately supplied on the one hand to an OR gate 34 and on the other hand to another OR gate 35. The inversion trigger signal is in this time used for selectively holding the output of the OR gates 34 and 35 at a high level such that, when the synthesis of the sin (A) function is in progress, the output of the gate 35 for cos (A) is held at the high level and that, when the synthesis of the cos (A) function is in progress, the output of the gate 34 for sin (A) is held at the high level.

When the low level inversion trigger signal is supplied from the increment producing circuit 22 to the inversion circuit 21, the inversion circuit 21 produces an output data Ar which is defined as Ar=A and the synthesis of sin (A) is commenced. Thus, the circuit 22 produces one bit increment data sequentially. In this mode of operation, the inversion trigger signal has a low level as shown in FIG. 7(b) and the output increment data is supplied to the sign selection circuit 27 which is identical to the corresponding circuit of FIG. 4 through the OR gate 34. On the other hand, the low level inversion trigger signal is supplied to the OR gate 36 via an inverter 35. Thus, the output of the OR gate 36 is held at the high level as already described.

When the synthesis of sin (A) is completed, the inversion trigger signal is turned to low. Responsive to this, the inversion circuit 21 produces the output data Ar which is now defined as Ar=256−A, and the circuit 22 commences the synthesis of cos (A). As will be readily appreciated, the output of the OR gate 34 is held at the high level in this mode of operation and the stepwise increment data is supplied from the OR gate 36 to a sign selection circuit 37. The sign selection circuit 37 provides the plus or minus sign selectively to the output data of the OR gate 34 or 36 in accordance with the value of the upper two bits of the input data Din similarly to the case of the first embodiment.

It should be realized that the output of the circuit 22 contains different number of output pulses in correspondence to the input data Din. Thus, the output data or pulse train of the circuit 22 may be regarded as a pulse signal subjected to pulse width modulation. Thus, one can obtain a corresponding analogue signal sin X and cos X by passing the output signal through low pass filters 38 and 39 after the sign selection circuit 37.

According to the present embodiment, the output of the circuit 22 is handled as analogue pulse train. Thus, one can eliminate the digital-to-analogue converter from the circuit 13. Thus, the driving circuit can be constructed compactly and with cheap cost.

It should be noted that the resolution of the increment producing circuit 22 is not limited to 8 bits but may be increased or decreased according to the needs. Further, the step function stored in the ROM 31 is not limited to the sinusoidal function but may be changed or modified according to the characteristic of the winding and the like. Further, the ROM 31 may be constructed by logic circuits or random access memory (RAM). In the latter case, the data in the memory can be modified according to the needs while performing the driving of the instrument. Further, the present invention, disclosed heretofore in terms of logic circuits, may be implemented by microcomputers and the like.

Further, the present invention is not limited to these embodiments but various variations and modifications may be made without departing from the scope of the present invention.

What is claimed is:

1. A driving circuit for driving a crossed-coil type instrument used for reading a physical quantity in which a pair of windings surrounding a movable magnet carrying a pointer needle thereon are disposed to cross each other with a predetermined mechanical angle, comprising:
   digital data conversion means supplied with an electrical signal representing said physical quantity to be measured for producing a digital data representing the electrical signal;
   pulse data producing means supplied with said digital data for producing a number of pulses in correspondence with said digital data such that each of the pulses represents a stepwise increment of a step function which approximates either one of a sine function and a cosine function defined as a function of the digital data; and
   drive signal generating means supplied with said pulses for synthesizing first and second analogue drive signals respectively representing a sine wave signal and a cosine wave signal which change sinusoidally with the input electrical signal therefrom, said driving signals being respectively supplied to said first and second windings for moving the magnet disposed in the first and second windings.

2. A driving circuit as claimed in claim 1 in which said pulse data producing means comprises memory means for storing said stepwise increment in a form of one bit binary data.

3. A driving circuit as claimed in claim 2 in which said pulse data producing means further comprises an oscillator running at a predetermined frequency and a counter for counting up a clock pulse produced by said oscillator, said counter producing an output to be supplied to said memory means as an address signal.

4. A driving circuit as claimed in claim 3 in which said pulse data producing means further comprises comparison means supplied with said digital data and the output of the counter for detecting the coincidence of the former and the latter and gate control means for selectively prohibiting the output of the pulse data producing means to be supplied to the drive signal generating means when the coincidence has been detected in the comparison means.

5. A driving circuit as claimed in claim 4 in which said counter produces a control signal for controlling the gate control means such that the pulse produced by the pulse data producing means is passed through the gate control means when the number of pulses counted by the counter has reached a predetermined value.

6. A driving circuit as claimed in claim 4 in which an uppermost bit part of the counter is supplied to said digital data conversion means as an inversion trigger signal, and said digital data conversion means produces a data which is an inversion of said digital data when the inversion trigger signal assumes a predetermined value.

7. A driving circuit as claimed in claim 6 in which said drive signal generating means comprises first and second OR gates each having a first input connected to said pulse data producing means for receiving the output pulse therefrom, said first OR gate having a second input connected to said pulse data producing means for receiving said inversion trigger signal and said second OR gate having a second input connected to said pulse data producing means for receiving said inversion trigger signal via an inverter, and low pass filter means for filtering outputs from said first and second OR gates.

8. A driving circuit as claimed in claim 1 in which said drive signal generating means comprises a sign selection circuit supplied with upper predetermined bits of said digital data for providing sign to the first and second drive signals such that the first and second drive signals bear a plus sign or minus sign responsive to the value of said upper predetermined bits.

9. A driving circuit for driving a crossed-coil type instrument used for reading a physical quantity in which a pair of windings surrounding a movable magnet carrying a pointer needle thereon are disposed to cross each other with a predetermined mechanical angle, comprising:

digital data conversion means supplied with an electrical signal representing said physical quantity to be measured for producing a digital data representing the electrical signal;

pulse data producing means supplied with said digital data for producing a number of pulses in correspondence with said digital data; and drive signal generating means supplied with said pulses for generating first and second analogue drive signals therefrom, said driving signals being respectively supplied to said first and second windings for moving the magnet disposed in the first and second windings;

said first and second drive signals being respectively a sine wave signal and a cosine wave signal which change sinusoidally with the input electrical signal, and the output pulse from said pulse data producing means representing a stepwise increment of a step function which approximates either one of the sine wave signal and the cosine wave signal;

said pulse data producing means comprising memory means for storing said stepwise increment in a form of one bit binary data, an oscillator running at a predetermined frequency, a counter for counting up a clock pulse produced by said oscillator, said counter producing an output to be supplied to said memory means as an address signal, comparison means supplied with said digital data and the output of the counter for detecting the coincidence of the former and the latter, and gate control means for selectively prohibiting the output of the pulse data producing means to be supplied to the drive signal generating means when the coincidence has been detected in the comparison means, wherein an uppermost bit part of the counter is supplied to said digital data conversion means as an inversion trigger signal and said digital data conversion means produces a data which is an inversion of said digital data when the inversion trigger signal assumes a predetermined value;

said drive signal generating means comprising a second counter for counting up the output pulse from the pulse data producing means and latch means for holding an output of said second counter.

10. A driving circuit as claimed in claim 9 in which said latch means comprises a first and second latch circuits connected to an output of said second counter for holding the same and a latch control circuit connected to said first and second latch circuits, said latch control circuit being supplied with said inversion trigger signal from said counter of the pulse data producing means for selectively enabling and disabling the first and second latch circuits responsive to the the inversion trigger signal.

11. A driving circuit as claimed in claim 9 in which said driving signal generating means comprises digital-to-analogue conversion means for conversing an output data of said latch means to said analogue driving signal.

* * * * *